United States Patent
Yang et al.

(10) Patent No.: US 7,129,134 B2
(45) Date of Patent: Oct. 31, 2006

(54) FABRICATION METHOD FOR FLASH MEMORY SOURCE LINE AND FLASH MEMORY

(75) Inventors: Jui-Hsiang Yang, Hsinchu (TW); Ing-Ruey Liaw, Hsinchu (TW); Yue-Feng Chen, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 10/992,729

(22) Filed: Nov. 22, 2004

(65) Prior Publication Data

US 2005/0181563 A1 Aug. 18, 2005

(30) Foreign Application Priority Data

Feb. 13, 2004 (TW) .............................. 93103465 A

(51) Int. Cl.
*H01L 21/336* (2006.01)

(52) U.S. Cl. ...................................... 438/258; 438/595

(58) Field of Classification Search ................ 438/257, 438/258, 259, 266, 593, 594, 595, 596, 697, 438/706
See application file for complete search history.

(56) References Cited

U.S. PATENT DOCUMENTS 6,649,471 B1 * 11/2003 Cho et al. .................... 438/257

* cited by examiner

*Primary Examiner*—Phuc T. Dang
(74) *Attorney, Agent, or Firm*—Birch, Stewart, Kolasch & Birch, LLP

(57) ABSTRACT

A fabrication method for flash memory. The method comprises providing a substrate, and a first insulation layer, a first conductive layer, a second insulation layer thereon. The second insulation layer is patterned to form a first opening and reveal a part of the first conductive layer, and a third insulation layer is formed on the first opening sidewall to form a second opening. The first conductive layer and the first insulation layer beneath the second opening are etched to expose the substrate surface, and a spacer is formed on the second opening sidewall. A source region is formed in the exposed substrate and a source line with a concave surface is formed in the second opening. A mask layer is formed on the source line concave surface.

21 Claims, 11 Drawing Sheets

FABRICATION METHOD FOR FLASH MEMORY SOURCE LINE AND FLASH MEMORY

BACKGROUND OF THE INVENTION

1. Field of the Invention

The present invention relates to a flash memory, and more particularly to a fabrication method for flash memory source line.

2. Description of the Related Art

A flash memory retains stored data without periodic electricity refresh and can be erased in blocks rather than one byte at a time. Each erasable memory block comprises a plurality of non-volatile memory cells arranged in rows and columns. Each cell is coupled to a word line, bit line and source line, with each word line coupled to a control gate of each cell in a row, each bit line coupled to a drain of each cell in a column, and the source line coupled to a source of each cell in an erasable block. The cells are programmed and erased by manipulating the voltages of the word lines, bit lines and source lines.

In FIG. 1, a conventional flash memory comprises a silicon substrate 10 and a source region S therein, with a source line 20 on the source region S. A floating gate 14 and silicon oxide layers 12 and 16 are disposed on the source line 20 sidewall, and the floating gate 14 is insulated from the source line 20 by a spacer 18. A control gate 24 is disposed on the outside of the floating gate 14, and the control gate 24 and the floating gate 14 are insulated by a silicon oxide layer 22.

SUMMARY OF THE INVENTION

The invention provides a fabrication method for flash memory source line, comprising: providing a substrate; forming a first insulation layer, a first conductive layer and a second insulation layer on the substrate sequentially; patterning the second insulation layer to expose a portion of the first conductive layer; forming a third insulation layer on the second insulation layer sidewalls; etching the exposed first conductive layer and the underneath first insulation layer to expose the substrate; forming a fourth insulation layer on the third insulation layer, the first conductive layer and the first insulation layer sidewalls; forming a source region in the exposed substrate; forming a source line with a concave surface on the source region; depositing a mask layer on the second insulation layer and the source line; and planarizing the mask layer to expose the second insulation layer and leave the mask layer on the source line concave surface.

DESCRIPTION OF THE DRAWINGS

For a better understanding of the present invention, reference is made to a detailed description to be read in conjunction with the accompanying drawings, in which.

Figure 1:
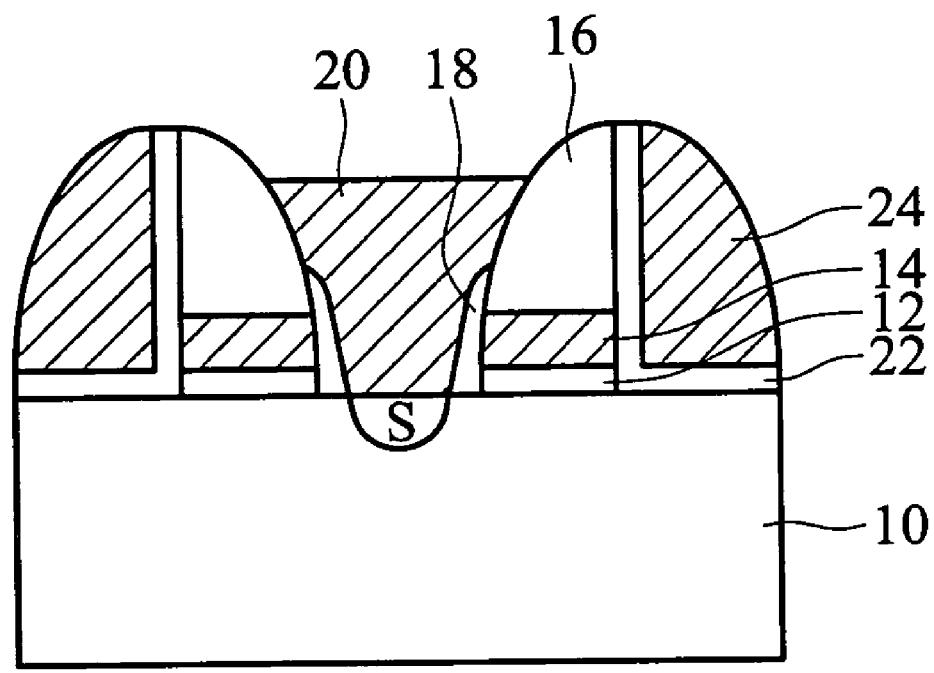
FIG. 1 is a cross-section showing the known flash memory.

REFERENCE NUMERALS IN THE DRAWINGS 10, 100, 200 semiconductor substrate
12, 16, 22, silicon oxide layer
14 floating gate
18 spacer
20 source line
24, 132, 232 control gate
102, 202 first insulation layer
104, 204 first conductive layer
106, 206 second insulation layer
108, 208 opening
110, 210 third insulation layer
120, 220 spacer
122, 222 second conductive layer
122a, 222a source line
122b thermal oxide layer
123 corner of the source line 122a and the third insulation layer 110
130 forth insulation layer
224, 240 mask layer
230 intergate dielectric layer
S source region

DETAILED DESCRIPTION OF THE INVENTION

FIGS. 2A~2J are cross-sections showing a fabrication method for flash memory source line. But this is not prior art for the purpose of determining the patentability of the present invention. This merely shows a problem found by the inventor.

Figure 2A:
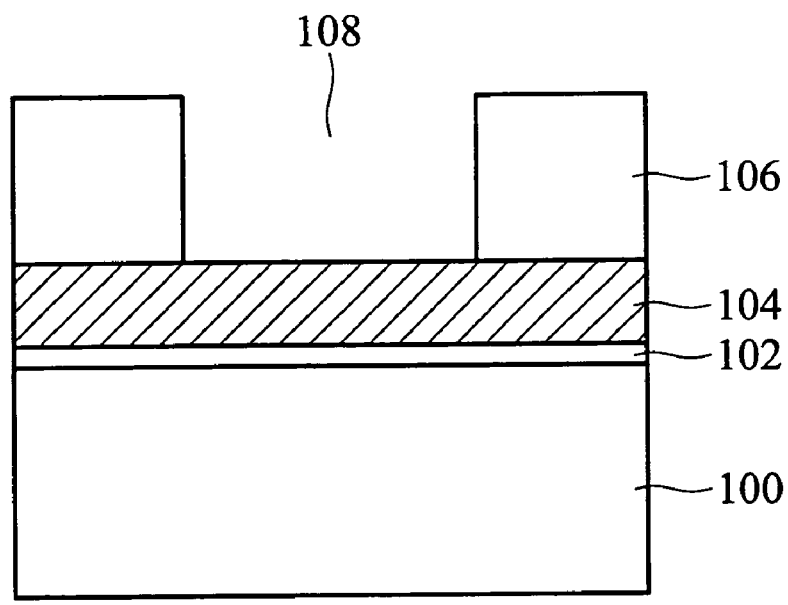
FIGS. 2A~2J are cross-sections showing a fabrication method for flash memory source line.

Referring to FIG. 2A, the semiconductor substrate 100 is provided. The semiconductor substrate 100 may comprise silicon substrate. A first insulation layer 102 and a first conductive layer 104 are deposited on the semiconductor substrate 100 sequentially. The first insulation layer 102 may comprise silicon oxide. The first conductive layer 104 may comprise polysilicon. The second insulation layer 106 is deposited on the conductive layer 104. The second insulation layer 106 may comprise silicon nitride. The opening 108 is formed in the second insulation layer 106 and a portion of the first conductive layer 104 is exposed by lithography and etching technology, for example.

Figure 2B:
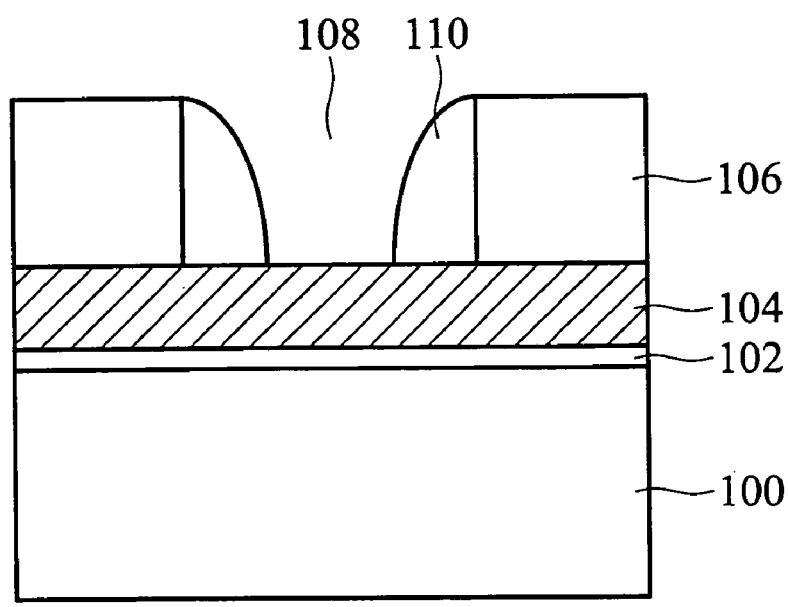

A third insulation layer 110 is conformal deposited on the second insulation layer 106, the opening 108 sidewalls and the exposed first conductive layer 104. The third insulation layer 110 may comprise TEOS oxide. The third insulation layer 110 is then etched by anisotropic etch, as shown in FIG. 2B.

Figure 2C:
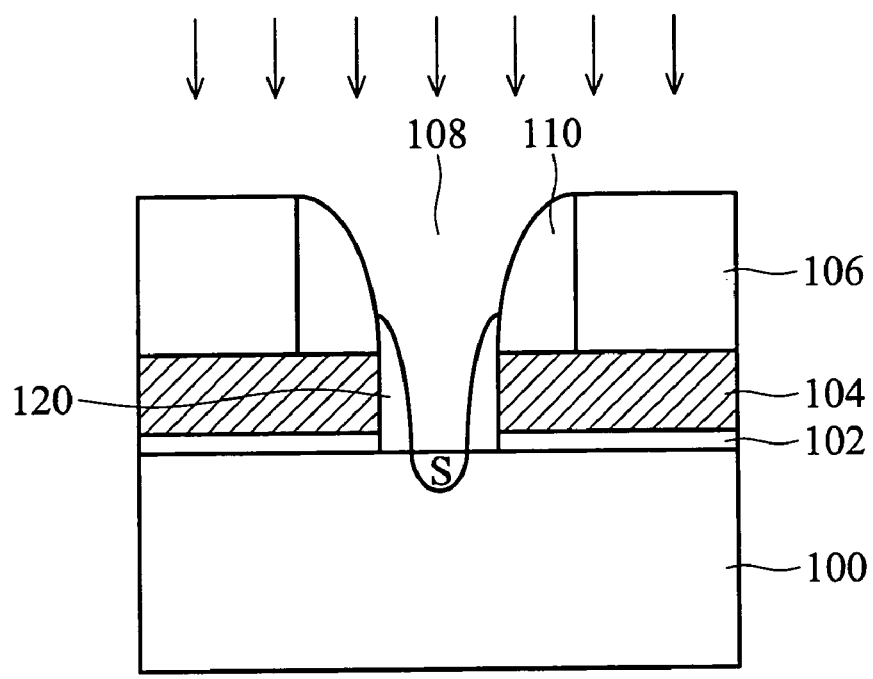

The exposed first conductive layer 104 and the underneath first insulation layer 102 are removed to expose a portion of the substrate 100. The spacer 120 is formed on the opening 108 sidewalls, and the height of the spacer 108 must be higher than the surface of the first conductive layer 104, as shown in FIG. 2C. The source region S is formed in the exposed substrate 100 by ion implantation, for example, as shown in FIG. 2C.

Figure 2D:
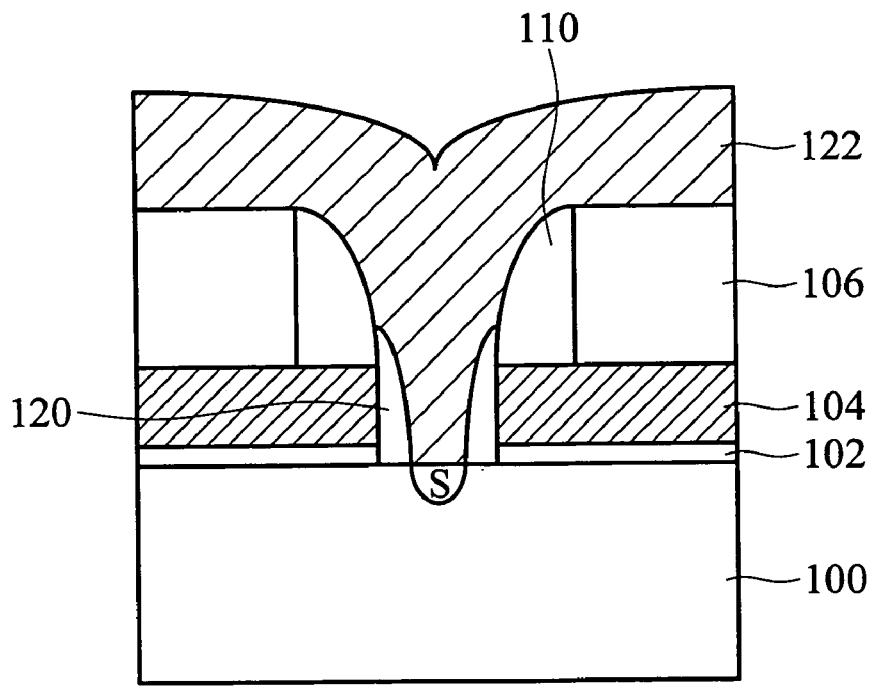
Figure 2E:
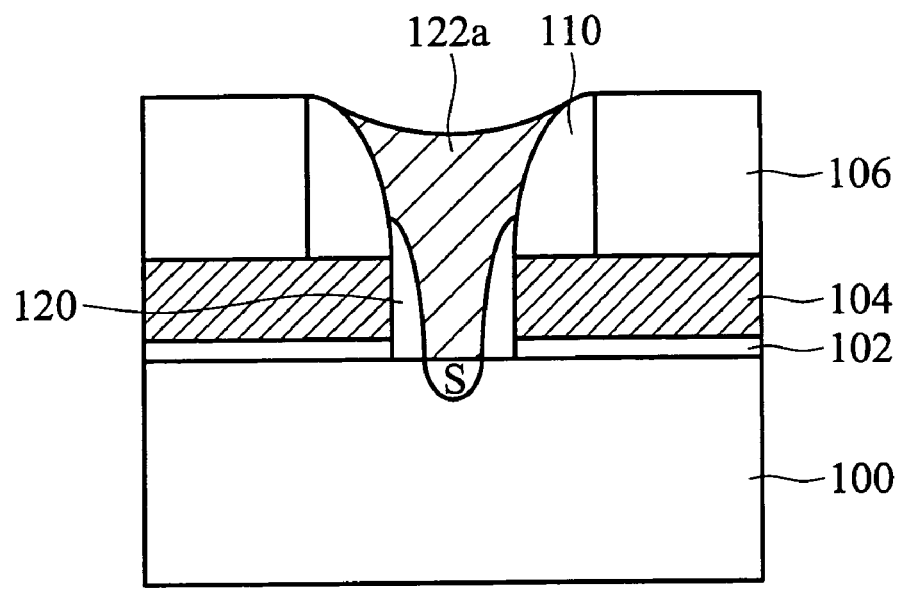

In the FIG. 2D, a second conductive layer 122 is conformal deposited on the second insulation layer 106 and in the opening 108. The second conductive layer 122 may comprise polysilicon. Then the second conductive layer 122 is etched back to expose the second insulation layer 106 and form a source line 122a with a concave surface, as shown in FIG. 2E.

Figure 2F:
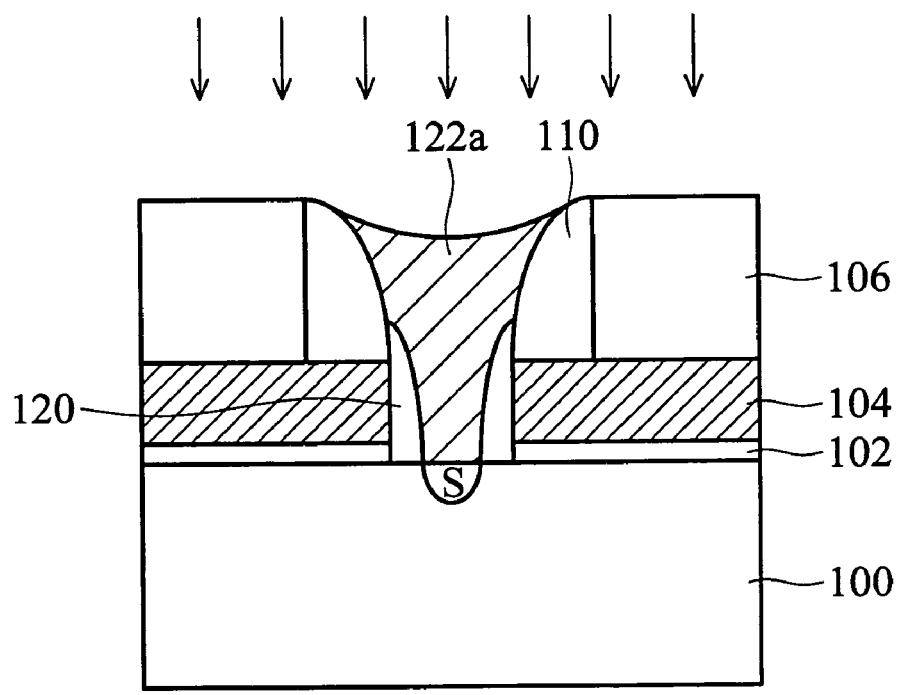

In the FIG. 2F, the source line 112a surface is transformed into amorphous silicon by ion implantation. For example, the source line 112a surface is damaged by 40 KeV as implantation to transform into amorphous silicon. Then the amorphous silicon is transformed into thermal oxide layer 122b by thermal oxidation, as shown in FIG. 2G.

Figure 2G:
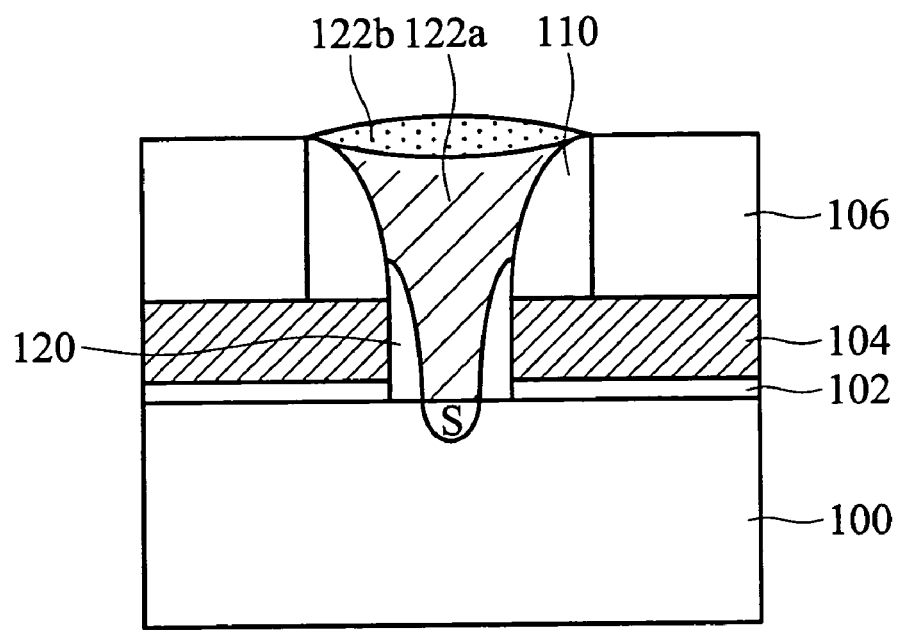
Figure 2H:
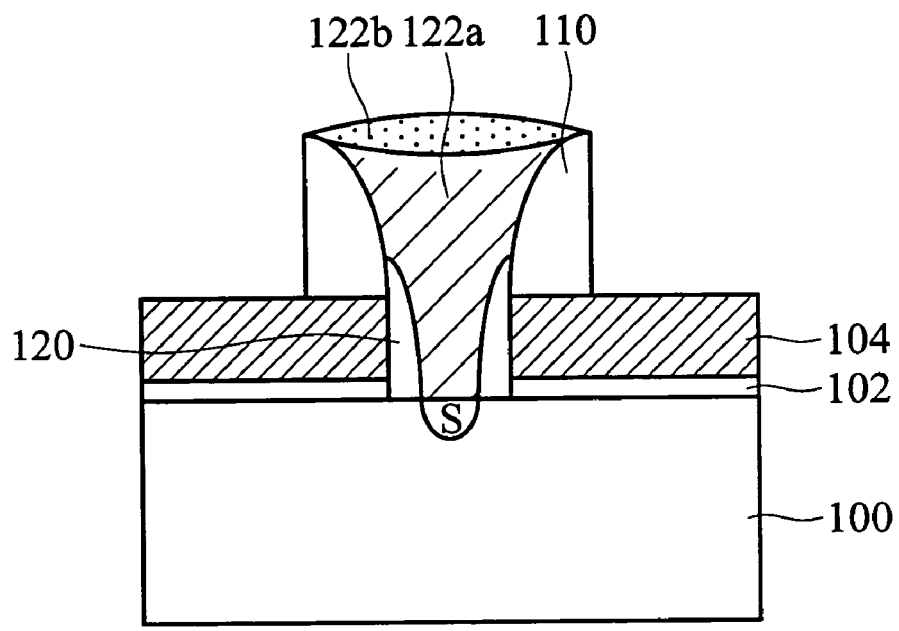
Figure 2I:
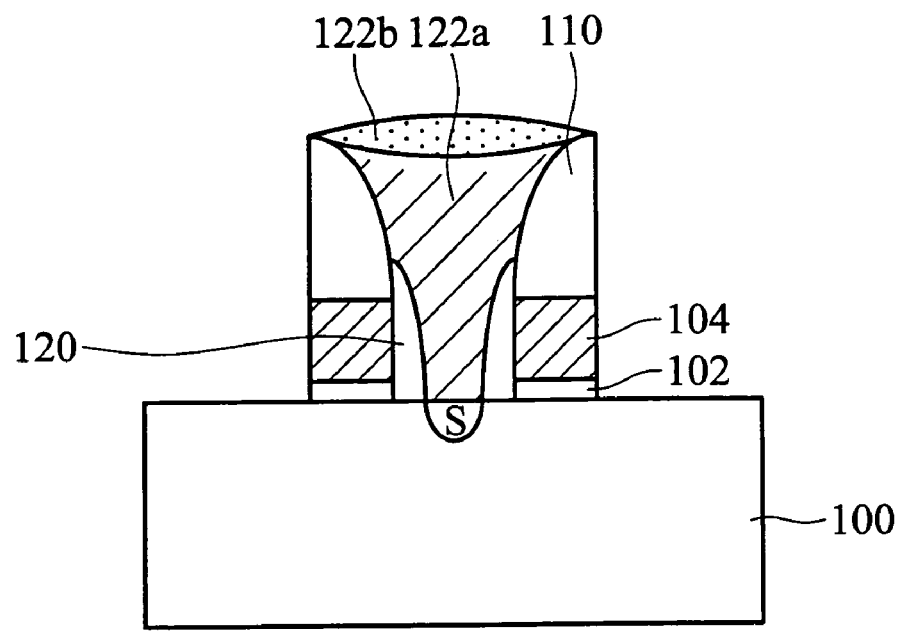
Figure 2J:
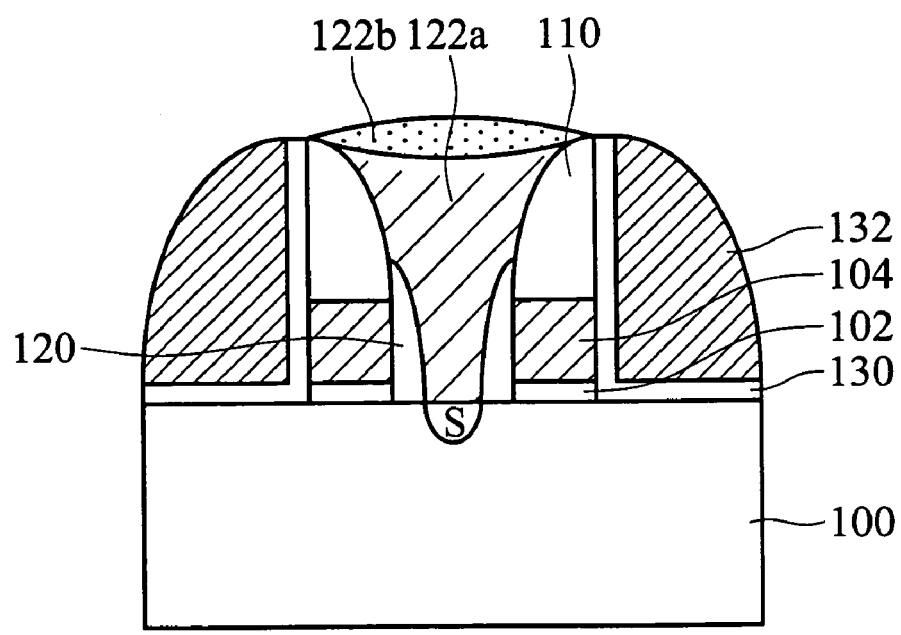

The second insulation layer 106 is removed, as shown in FIG. 2H. The exposed first conductive layer 104 and the underneath first insulation layer 102 are removed, as shown in FIG. 2I. After the removal process, the first conductive layer 104 is formed as a floating gate. In this floating gate definition step, the source line 122a and the first conductive layer 104 would be removed at the same time without thermal oxide layer 122b. Because the source line 122a and the first conductive layer 104 both are polysilicon.

A control gate 132 is formed on the floating gate 104 sidewall. The control gate 132 may be polysilicon. The control gate 132 is isolated from the substrate 100 and the floating gate 104 by the fourth insulation layer 130. The forth insulation layer 130 may be silicon oxide.

In the FIG. 2G, oxygen may diffuse into the flash structure from the corner 122b between the source line 122a and the third insulation layer 110 in the oxidation step. The oxygen diffusion may oxidize the inner portion of source line 122a. It decreases the source line 122a quality and the device performance seriously.

Accordingly, the present invention is to provide a fabrication method for flash memory source line and flash memory to address this issue.

In order to understand the above and other objects, characteristics and advantages, the preferred embodiment of the present invention is now detailed described with reference to the attached figures.

FIGS. 3A–3J are cross-sections showing a fabrication method for flash memory source line according to the embodiment of the present invention.

Figure 3A:
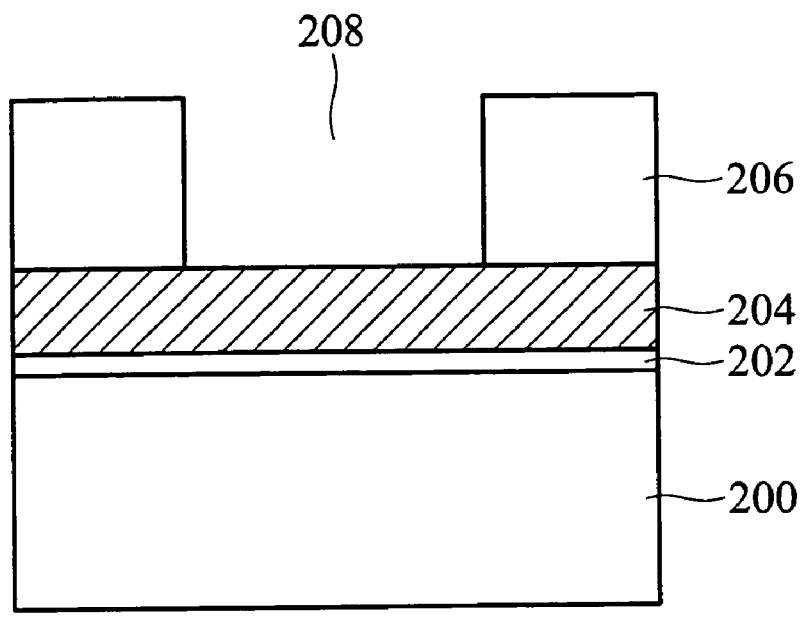
FIGS. 3A~3J are cross-sections showing a fabrication method for flash memory source line according to the embodiment of the present invention.

Referring to FIG. 3A, a semiconductor substrate 200 is provide. The semiconductor substrate 200 may comprise silicon substrate. A first insulation layer 202, a first conductive layer 204 and a second insulation layer 206 are sequentially formed on the semiconductor substrate 200. The first insulation layer 202 may comprise silicon oxide. The first conductive layer 204 may comprise polysilicon. The second insulation layer 206 may comprise silicon nitride. The second insulation layer 206 is patterned to form the opening 208 and expose a portion of the first conductive layer 204. The patterning step may comprise lithography and etching technology.

Figure 3B:
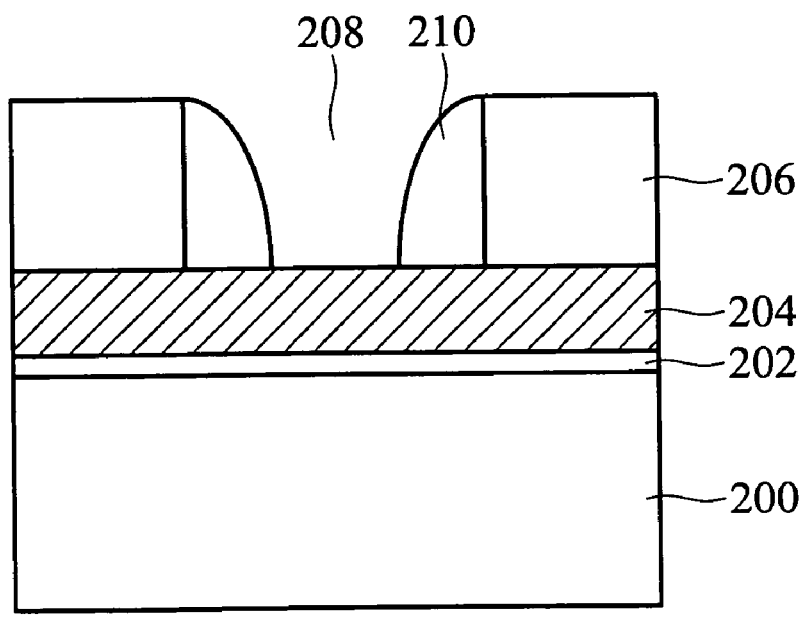

A third insulation layer 210 is conformal deposited on the second insulation layer 206, the opening 208 sidewalls and the exposed first conductive layer 204. The third insulation layer 210 may comprise TEOS oxide. The third insulation layer 210 is then etched by anisotropic etch, as shown in FIG. 3B.

Figure 3C:
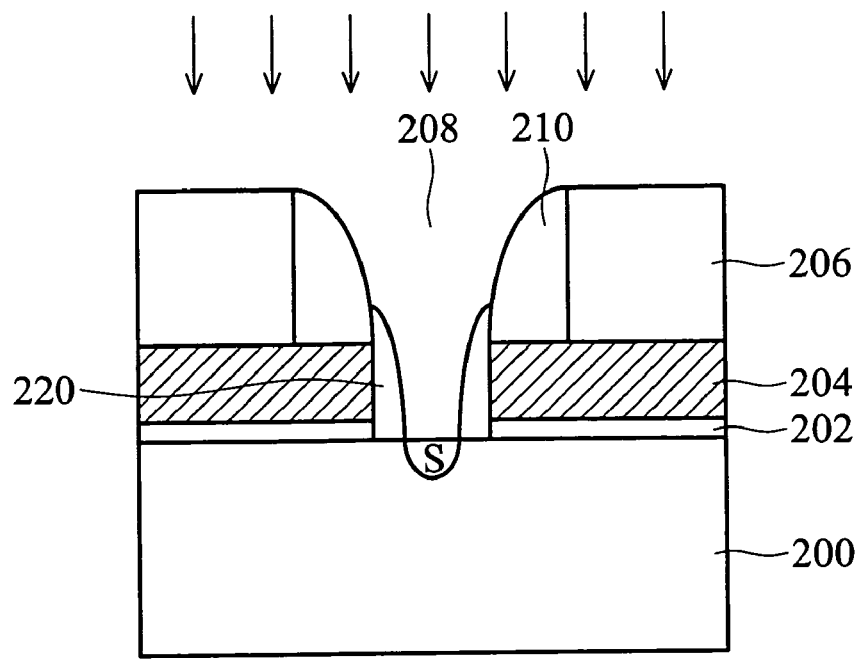

The exposed first conductive layer 204 and the underneath first insulation layer 202 are removed to expose a portion of the substrate 200. The spacer 220 is formed on the opening 208 sidewalls, and the height of the spacer 208 must be higher than the surface of the first conductive layer 204, as shown in FIG. 3C. The source region S is formed in the exposed substrate 200 by ion implantation, for example, as shown in FIG. 3C.

Figure 3D:
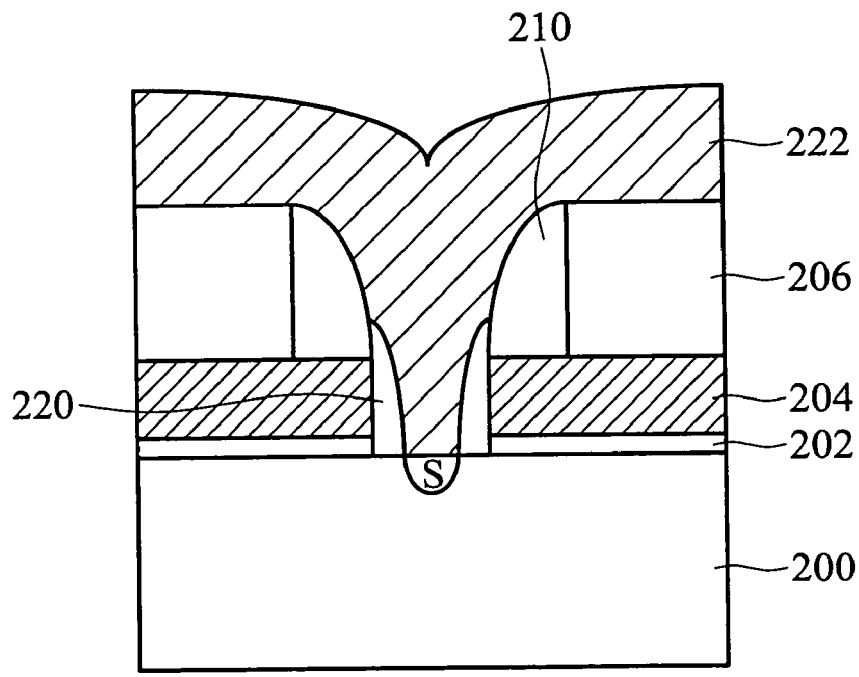
Figure 3E:
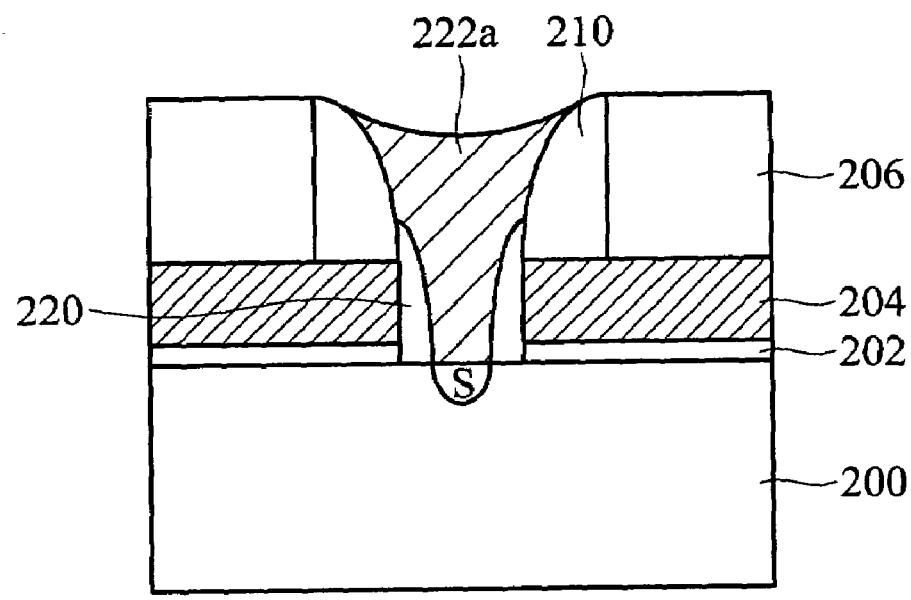

In the FIG. 3D, a second conductive layer 222 is conformal deposited on the second insulation layer 206 and in the opening 208. The second conductive layer 222 may comprise polysilicon. Then the second conductive layer 222 is etched back to expose the second insulation layer 206 and form a source line 222a with a concave surface, as shown in FIG. 3E.

Figure 3F:
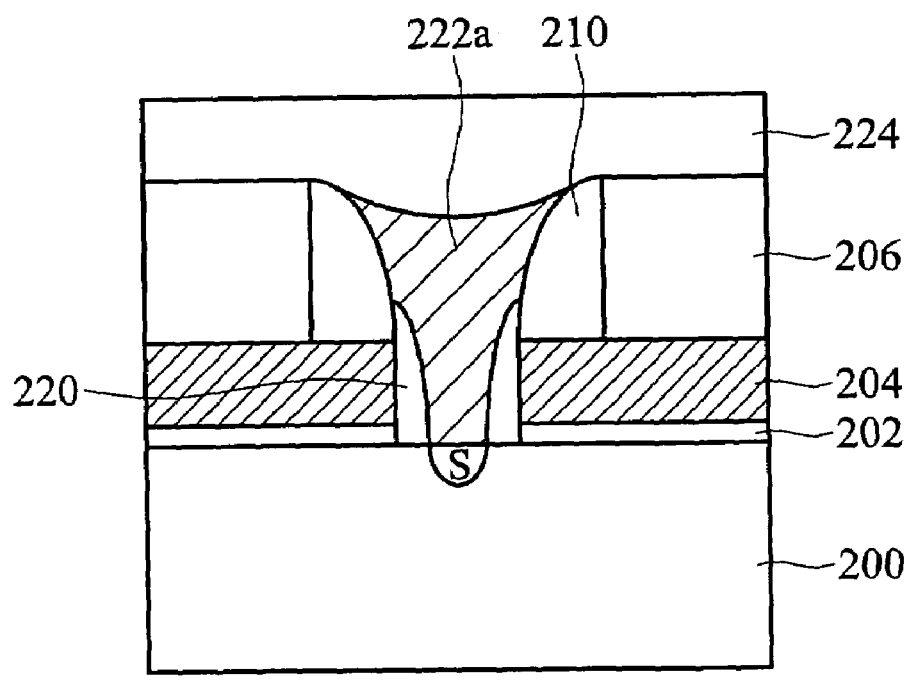
Figure 3G:
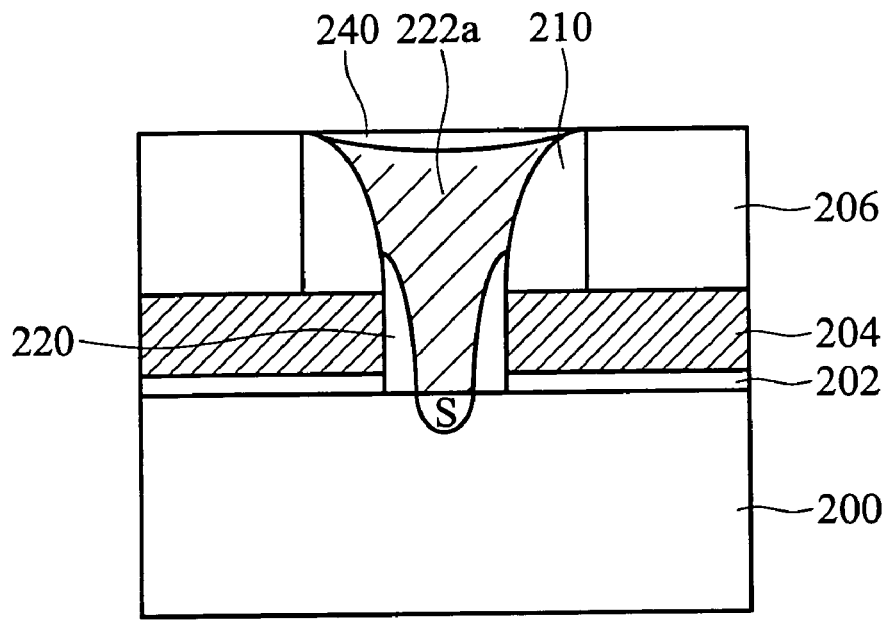

The steps shown in the FIGS. 3F and 3G are the feature of the present invention to address the above-discussed issue.

In the FIG. 3F, a mask layer 224 is formed on the second insulation layer 206 and second conductive layer 222. The mask layer 224 may comprise oxide layer, such as TEOS oxide layer. The mask layer 224 is densified by anneal, for example.

The mask layer 224 is planarized by chemical mechanical polishing (CMP) to expose the second insulation layer 206 and leave the mask layer 240 on the source line 222a concave surface, as shown in FIG. 3G.

Figure 3H:
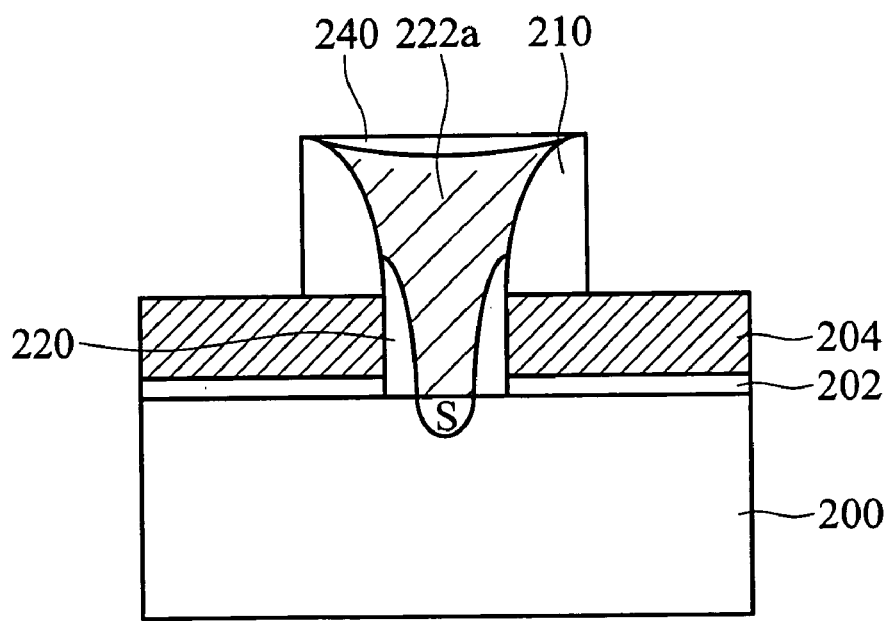

The second insulation layer 206 is removed as shown in the FIG. 3H. For example, the second insulation layer 206 may be removed by wet etching and using the $H_3PO_4$ as the etchant.

Figure 3I:
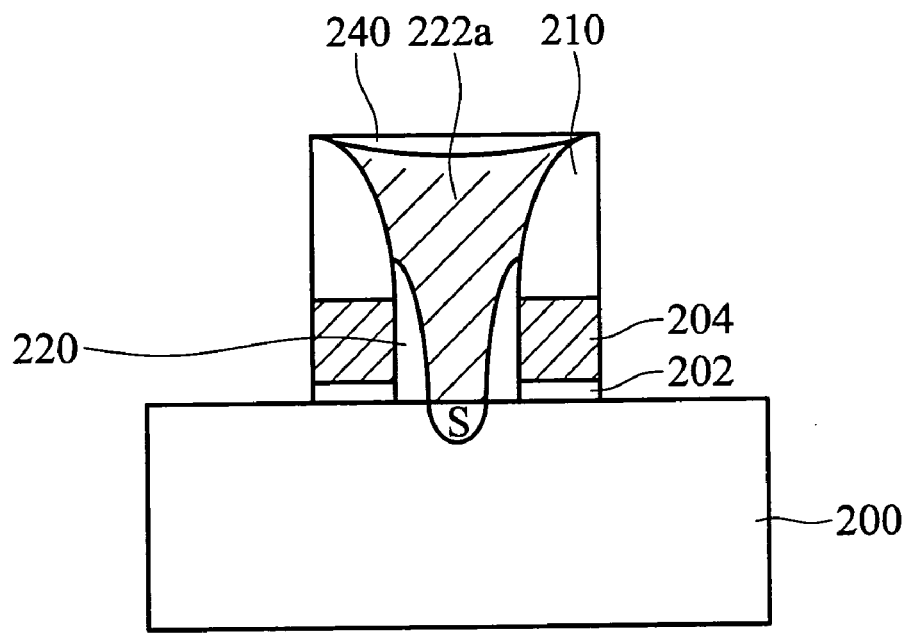
Figure 3J:
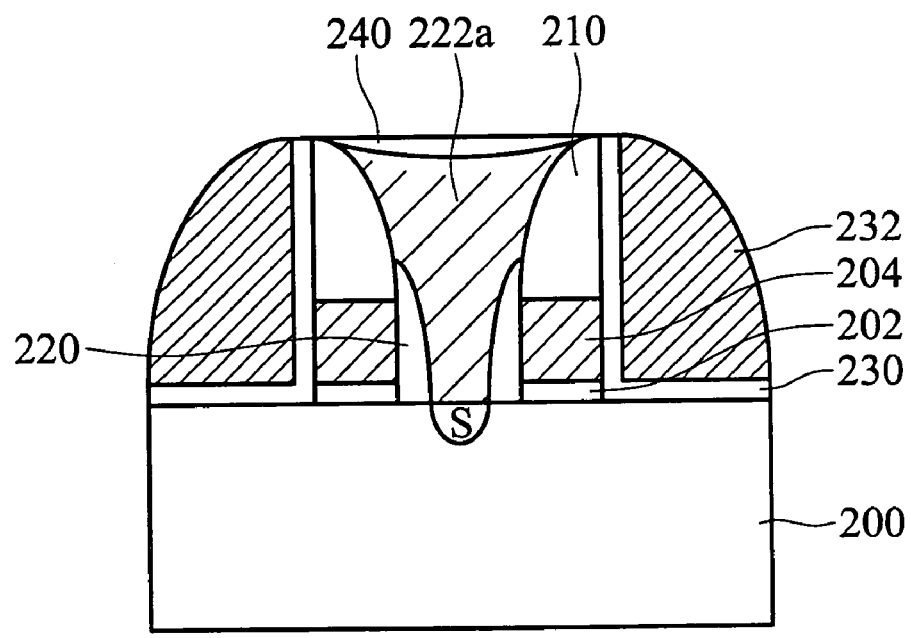

The exposed first conductive layer 204 and the underneath first insulation layer 202 are removed, as shown in FIG. 3I. After the removal process, the first conductive layer 204 is formed as a floating gate. In this floating gate definition step, the source line 222a and the first conductive layer 204 would be removed at the same time without the mask layer 240. Because the source line 222a and the first conductive layer 204 both are polysilicon. The mask layer 240 is formed without thermal oxidation, so the above-mentioned oxygen insertion issue is addressed.

Finally, an insulation layer is conformal deposited on the device then etched back to form an intergate dielectric layer 230. The intergate dielectric layer 230 is on the third insulation layer 210, the first conductive layer 204, the first insulation layer 202 and the substrate 200. The intergate dielectric layer 230 may comprise silicon oxide layer. A control gate 232 is formed on the intergate dielectric layer 230. The control gate 232 may comprise polysilicon and is isolated from the floating gate 204 by the intergate dielectric layer 230.

While the invention has been described by way of example and in terms of the preferred embodiment, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fabrication method for flash memory source line, comprising:
   providing a substrate;
   forming a first insulation layer, a first conductive layer and a second insulation layer on the substrate sequentially;
   patterning the second insulation layer to expose a portion of the first conductive layer;
   forming a third insulation layer on the second insulation layer sidewalls;
   etching the exposed first conductive layer and the underneath first insulation layer to expose the substrate;
   forming a fourth insulation layer on the third insulation layer, the first conductive layer and the first insulation layer sidewalls;
   forming a source region in the exposed substrate;
   forming a source line with a concave surface on the source region;
   depositing a mask layer on the second insulation layer and the source line; and planarizing the mask layer to expose the second insulation layer and leave the mask layer on the source line concave surface.

2. The fabrication method for flash memory source line as claimed in claim 1, wherein the substrate comprises silicon substrate.

3. The fabrication method for flash memory source line as claimed in claim 1, wherein the first insulation layer comprises silicon oxide.

4. The fabrication method for flash memory source line as claimed in claim 1, wherein the first conductive layer comprises polysilicon.

5. The fabrication method for flash memory source line as claimed in claim 1, wherein the second insulation layer comprises silicon nitride.

6. The fabrication method for flash memory source line as claimed in claim 1, wherein the third insulation layer comprises silicon oxide.

7. The fabrication method for flash memory source line as claimed in claim 1, wherein the fourth insulation layer comprises silicon oxide and/or silicon nitride.

8. The fabrication method for flash memory source line as claimed in claim 1, wherein the second conductive layer comprises polysilicon.

9. The fabrication method for flash memory source line as claimed in claim 1, wherein the mask layer comprises TEOS oxide.

10. The fabrication method for flash memory source line as claimed in claim 9, further comprises annealing the TEOS oxide.

11. A fabrication method for flash memory, comprising:
providing a substrate;
forming a first insulation layer, a first conductive layer and a second insulation layer on the substrate sequentially;
patterning the second insulation layer to expose a portion of the first conductive layer;
forming a first spacer on the second insulation layer sidewalls;
etching the exposed first conductive layer and the underneath first insulation layer sequentially to expose the substrate;
forming a second spacer on the first spacer, the first conductive layer and the first insulation layer sidewalls;
forming a source region in the exposed substrate;
forming a source line with a concave surface in the source region;
depositing a mask layer on the second insulation layer and the source line;
planarizing the mask layer to expose the second insulation layer and leave the mask layer on the source line concave surface;
removing the second insulation layer and the first conductive layer and the first insulation layer beneath the second insulation layer, to form a floating gate and a tunneling oxide layer; and
forming a control gate on the floating gate sidewall, and the control gate is isolated with the substrate and the floating gate.

12. The fabrication method for flash memory as claimed in claim 11, wherein the substrate comprises silicon substrate.

13. The fabrication method for flash memory as claimed in claim 11, wherein the first insulation layer comprises silicon oxide.

14. The fabrication method for flash memory as claimed in claim 11, wherein the first conductive layer comprises polysilicon.

15. The fabrication method for flash memory as claimed in claim 11, wherein the second insulation layer comprises silicon nitride.

16. The fabrication method for flash memory as claimed in claim 11, wherein the first spacer comprises silicon oxide.

17. The fabrication method for flash memory as claimed in claim 11, wherein the second spacer comprises silicon oxide and/or silicon nitride.

18. The fabrication method for flash memory as claimed in claim 11, wherein the second conductive layer comprises polysilicon.

19. The fabrication method for flash memory as claimed in claim 11, wherein the mask layer comprises TEOS oxide.

20. The fabrication method for flash memory as claimed in claim 19, further comprises annealing the TEOS oxide.

21. The fabrication method for flash memory as claimed in claim 11, wherein the control gate comprises polysilicon.

* * * * *